(12) United States Patent
Ichikawa et al.

(10) Patent No.: US 11,525,873 B2
(45) Date of Patent: Dec. 13, 2022

(54) MAGNETORESISTANCE EFFECT ELEMENT INCLUDING AT LEAST ONE HEUSLER ALLOY LAYER AND AT LEAST ONE DISCONTINUOUS NON-MAGNETIC LAYER

(71) Applicant: TDK CORPORATION, Tokyo (JP)

(72) Inventors: Shinto Ichikawa, Tokyo (JP); Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 132 days.

(21) Appl. No.: 17/164,958

(22) Filed: Feb. 2, 2021

(65) Prior Publication Data
US 2021/0286028 A1 Sep. 16, 2021

(30) Foreign Application Priority Data
Feb. 5, 2020 (JP) .............................. JP2020-017780

(51) Int. Cl.
*G11B 5/39* (2006.01)
*G01R 33/09* (2006.01)
*H01L 43/10* (2006.01)
*H01L 43/08* (2006.01)
*H01L 43/02* (2006.01)

(52) U.S. Cl.
CPC ......... *G01R 33/093* (2013.01); *G01R 33/098* (2013.01); *G11B 5/3906* (2013.01); *G11B 5/3909* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS 6,365,286 B1 * 4/2002 Inomata ............... G11B 5/3909
365/171
6,937,446 B2 * 8/2005 Kamiguchi ......... H01F 10/3259
(Continued)

FOREIGN PATENT DOCUMENTS

JP 6137577 B2 5/2017

OTHER PUBLICATIONS

Choi, Y. et al., "Enhancement of current-perpendicular-to-plane giant magnetoresistance by insertion of amorphous ferromagnetic underlayer in Heusler alloy-based spin-valve structures," Applied Physics Express, vol. 10, No. 013006, 2017, pp. 1-4.
(Continued)

*Primary Examiner* — Jefferson A Evans
(74) *Attorney, Agent, or Firm* — Oliff PLC

(57) ABSTRACT

A magnetoresistance effect element includes a first ferromagnetic layer, a second ferromagnetic layer, a first non-magnetic layer; and a second non-magnetic layer, wherein, the first ferromagnetic layer and the second ferromagnetic layer are formed so that at least one of them includes a Heusler alloy layer, the first non-magnetic layer is provided between the first ferromagnetic layer and the second ferromagnetic layer, the second non-magnetic layer is in contact with any surface of the Heusler alloy layer and has a discontinuous portion with respect to a lamination surface, and the second non-magnetic layer is made of a material different from that of the first non-magnetic layer and is a (001)-oriented oxide containing Mg.

10 Claims, 11 Drawing Sheets

(56) References Cited

U.S. PATENT DOCUMENTS

| | | | | |
|---|---|---|---|---|
| 7,453,672 | B2* | 11/2008 | Dieny | H01F 10/3254 |
| 8,040,641 | B2* | 10/2011 | Miyauchi | G11B 5/398 |
| | | | | 360/324.1 |
| 8,228,643 | B2* | 7/2012 | Yuasa | G11B 5/3983 |
| | | | | 360/324 |
| 9,412,399 | B2 | 8/2016 | Childress et al. | |
| 9,865,799 | B2* | 1/2018 | Kim | H01L 27/222 |
| 10,388,856 | B2* | 8/2019 | Sasaki | H01L 43/08 |
| 10,825,985 | B2* | 11/2020 | Ichikawa | H01L 43/10 |
| 11,005,035 | B2* | 5/2021 | Suzuki | H01L 43/10 |
| 11,328,743 | B2* | 5/2022 | Nakatani | H01F 10/3259 |
| 2012/0091548 | A1 | 4/2012 | Sukegawa | H01L 43/10 |
| | | | | 257/E29.323 |
| 2016/0019917 | A1 | 1/2016 | Du et al. | |
| 2017/0229643 | A1* | 8/2017 | Chen | H01F 10/16 |
| 2020/0035913 | A1* | 1/2020 | Ichikawa | H01F 10/3254 |
| 2020/0303630 | A1* | 9/2020 | Ichikawa | H01L 43/14 |
| 2020/0357985 | A1* | 11/2020 | Sukegawa | G01R 33/0052 |
| 2021/0343321 | A1* | 11/2021 | Wang | G11C 11/161 |

OTHER PUBLICATIONS

Goripati, H.S., et al., "Bi-quadratic interlayer exchange coupling in Co2MnSi/Ag/Co2MnSi pseudo spin-valve," Journal of Applied Physics, vol. 110, No. 123914, 2011, pp. 1-7.

Furubayashi, T. et al., "Structure and transport properties of current-perpendicular-to-plane spin valves using Co2FeAl0.5Si0.5 and Co2MnSi Heusler alloy electrodes," Journal of Applied Physics, vol. 107, No. 113917, 2010, pp. 1-7.

Iwase, T. et al., "Large Interface Spin-Asymmetry and Magnetoresistance in Fully Epitaxial Co2MnSi/Ag/Co2MnSi Current-Perpendicular-to-Plane Magnetoresistive Devices," Applied Physics Express, vol. 2, No. 063003, 2009, pp. 1-3.

Jung, J.W., et al., "Enhancement of magnetoresistance by inserting thin NiAl layers at the interfaces in Co2FeGa0.5Ge0.5/Ag/Co2FeGa0.5Ge0.5 current-perpendicular-to-plance pseudo spin valves," Applied Physics Letters, vol. 108, No. 102408, 2016, pp. 1-5.

* cited by examiner

MAGNETORESISTANCE EFFECT ELEMENT INCLUDING AT LEAST ONE HEUSLER ALLOY LAYER AND AT LEAST ONE DISCONTINUOUS NON-MAGNETIC LAYER

CROSS-REFERENCE TO RELATED APPLICATION

Priority is claimed on Japanese Patent Application No. 2020-017780, filed Feb. 5, 2020, the content of which is incorporated herein by reference.

BACKGROUND OF THE INVENTION

Field of the Invention

The present invention relates to a magnetoresistance effect element.

Description of Related Art

A magnetoresistance effect element is an element that changes a resistance value in a lamination direction by a magnetoresistance effect. The magnetoresistance effect element includes two ferromagnetic layers and a non-magnetic layer interposed therebetween. The magnetoresistance effect element in which a conductor is used for the non-magnetic layer is referred to as a giant magnetoresistance effect (GMR) element and the magnetoresistance effect element in which an insulating layer (a tunnel barrier layer and a barrier layer) is used for the non-magnetic layer is referred to as a tunneling magnetoresistance effect (TMR) element. The magnetoresistance effect element can be applied to various applications such as magnetic sensors, radio frequency components, magnetic heads, and magnetic random access memories (MRAM).

U.S. Pat. No. 9,412,399 describes a magnetic sensor including a magnetoresistance effect element in which a Heusler alloy is used for a ferromagnetic layer. The Heusler alloy has high spin polarization and is expected to increase an output signal of the magnetic sensor. Meanwhile, U.S. Pat. No. 9,412,399 describes that a Heusler alloy is difficult to be crystallized unless a film is formed on a thick underlying substrate having a high temperature or predetermined crystallinity. U.S. Pat. No. 9,412,399 describes that the film formation at a high temperature or the thick underlying substrate causes a decrease in the output of the magnetic sensor. U.S. Pat. No. 9,412,399 describes that the output of the magnetic sensor increases by forming the ferromagnetic layer as a laminated structure of a non-crystalline layer and a crystalline layer.

SUMMARY OF THE INVENTION

The magnitude of the output signal of the magnetic sensor depends on the magnetoresistance change rate (MR ratio) of the magnetoresistance effect element. In general, the MR ratio tends to be larger as the crystallinity of the ferromagnetic layers sandwiching the non-magnetic layer becomes higher. In the magnetoresistance effect element described in U.S. Pat. No. 9,412,399, the ferromagnetic layers sandwiching the non-magnetic layer are amorphous and a sufficiently large MR ratio is difficult to be obtained.

The present disclosure has been made in view of the above-described circumstances and an object of the present disclosure is to provide a magnetoresistance effect element capable of realizing a large MR ratio.

The present disclosure provides the following magnetoresistance effect element in order to solve the above-described problems.

(1) A magnetoresistance effect element according to a first aspect includes a first ferromagnetic layer, a second ferromagnetic layer, a first non-magnetic layer; and a second non-magnetic layer, wherein, the first ferromagnetic layer and the second ferromagnetic layer are formed so that at least one of them includes a Heusler alloy layer, the first non-magnetic layer is provided between the first ferromagnetic layer and the second ferromagnetic layer, the second non-magnetic layer is in contact with any surface of the Hensler alloy layer and has a discontinuous portion with respect to a lamination surface, and the second non-magnetic layer is made of a material different from that of the first non-magnetic layer and is a (001)-oriented oxide containing Mg.

(2) In the magnetoresistance effect element according to the above (1), the area ratio occupied by the second non-magnetic layer in a plan view from a lamination direction may be 10% or more and 80% or less.

(3) In the magnetoresistance effect element according to the above (2), the area ratio occupied by the second non-magnetic layer in the plan view from the lamination direction may be 20% or more and 60% or less.

(4) In the magnetoresistance effect element according to any one of the above (1) to (3), the Heusler alloy layer may be mainly oriented in a (001) direction.

(5) In the magnetoresistance effect element according to any one of the above (1) to (4), the second non-magnetic layer may contain one or more element selected from the group consisting of Al, Ga, Ti, and Ni.

(6) In the magnetoresistance effect element according to any one of the above (1) to (5), the Heusler alloy layer may be represented by a composition formula $Co_2Y_\alpha Z_\beta$, the Y may be one or more elements selected from the group consisting of Fe, Mn, and Cr, the Z may be one or more elements selected from the group consisting of Si, Al, Ga, and Ge, and $\alpha+\beta>2$ may be satisfied.

(7) In the magnetoresistance effect element according to the above (6), the Y may be Fe and the Z may be Ga and Ge.

(8) In the magnetoresistance effect element according to any one of the above (1) to (7), the Heusler alloy layer may be represented by a composition formula $Co_2Fe_\alpha Ga_{\beta 1}Ge_{\beta 2}$, and $\alpha+\beta 1+\beta 2 \geq 2.3$, $\alpha<\beta 1+\beta 2$, $0.5<\alpha<1.9$, $0.1\leq\beta 1$, and $0.1\leq\beta 2$ may be satisfied.

(9) In the magnetoresistance effect element according to any one of the above (1) to (8), the first non-magnetic layer may be a metal or alloy containing one or more element selected from the group consisting of Cu, Au, Ag, Al, and Cr.

(10) The magnetoresistance effect element according to any one of the above (1) to (9) may further include a substrate, the substrate may be an underlying layer on which the first ferromagnetic layer, the second ferromagnetic layer, the first non-magnetic layer, and the second non-magnetic layer are laminated, and the substrate may be amorphous.

A magnetoresistance effect element according to the present disclosure exhibits a large MR ratio.

DETAILED DESCRIPTION OF THE INVENTION

Figure 1:
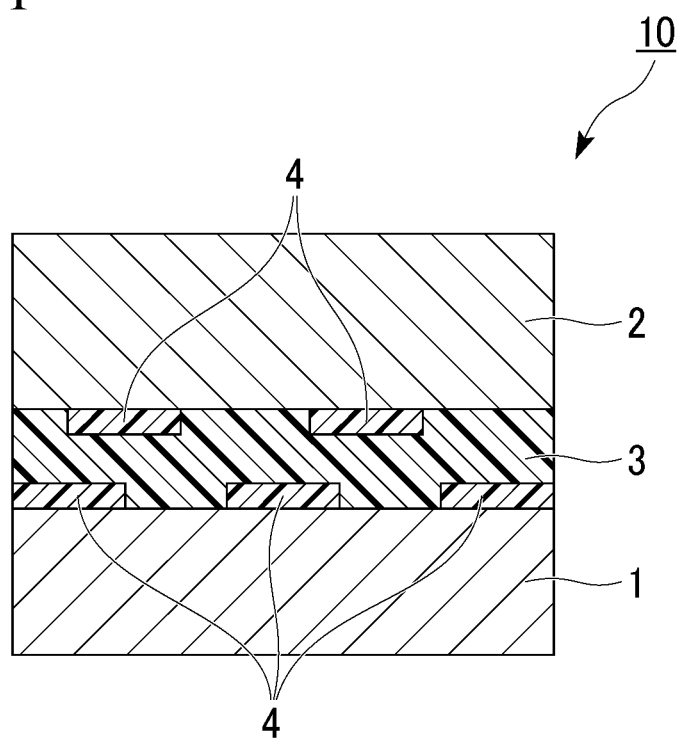
FIG. 1 is a cross-sectional view of a magnetoresistance effect element according to a first embodiment.

Hereinafter, this embodiment will be described in detail by appropriately referring to the drawings. The drawings used in the following description may be enlarged for convenience in order to make the features of this embodiment easy to understand and the dimensional ratio of each component may differ from the actual one. The materials, dimensions, and the like provided as exemplary examples in the following description are examples and the present disclosure is not limited thereto. For example, the present disclosure can be appropriately modified without changing the gist thereof.

First Embodiment

FIG. 1 is a cross-sectional view of a magnetoresistance effect element according to a first embodiment. First, directions will be defined. The direction in which layers are laminated may be referred to as a lamination direction. Further, a direction that intersects the lamination direction and spreads each layer may be referred to as an in-plane direction.

A magnetoresistance effect element 10 shown in FIG. 1 includes a first ferromagnetic layer 1, a second ferromagnetic layer 2, a first non-magnetic layer 3, and a second non-magnetic layer 4.

The magnetoresistance effect element 10 outputs a change in the relative angle between the magnetization of the first ferromagnetic layer 1 and the magnetization of the second ferromagnetic layer 2 as a resistance value change. For example, the magnetization of the second ferromagnetic layer 2 moves easily rather than the magnetization of the first ferromagnetic layer 1. When a predetermined external force is applied, the magnetization direction of the first ferromagnetic layer 1 is not changed (is fixed) and the direction of the magnetization of the second ferromagnetic layer 2 is changed. The resistance value of the magnetoresistance effect element 10 changes as the magnetization direction of the second ferromagnetic layer 2 changes with respect to the magnetization direction of the first ferromagnetic layer 1. In this case, the first ferromagnetic layer 1 may be referred to as a magnetization fixed layer and the second ferromagnetic layer 2 may be referred to as a magnetization free layer. Hereinafter, the first ferromagnetic layer 1 will be described as the magnetization fixed layer and the second ferromagnetic layer 2 will be described as the magnetization free layer. However, this relationship may be reversed.

A difference in the ease of the movement between the magnetization of the first ferromagnetic layer 1 and the magnetization of the second ferromagnetic layer 2 when a predetermined external force is applied is generated by a difference in coercivity between the first ferromagnetic layer 1 and the second ferromagnetic layer 2. For example, when the thickness of the second ferromagnetic layer 2 is set to be thinner than the thickness of the first ferromagnetic layer 1, the coercivity of the second ferromagnetic layer 2 becomes smaller than the coercivity of the first ferromagnetic layer 1. Further, for example, an antiferromagnetic layer may be provided on a surface on the side opposite to the first non-magnetic layer 3 in the first ferromagnetic layer 1 with a spacer layer interposed therebetween. The first ferromagnetic layer 1, the spacer layer, and the antiferromagnetic layer have a synthetic antiferromagnetic structure (SAF structure). The synthetic antiferromagnetic structure includes two magnetic layers with a spacer layer interposed therebetween. The antiferromagnetic coupling between the first ferromagnetic layer 1 and the antiferromagnetic layer increases the coercivity of the first ferromagnetic layer 1 as compared with the case without the antiferromagnetic layer. The antiferromagnetic layer is, for example, IrMn, PtMn, or the like. The spacer layer contains, for example, at least one selected from the group consisting of Ru, Ir, and Rh.

The first ferromagnetic layer 1 and the second ferromagnetic layer 2 contain a ferromagnetic material. All of the first ferromagnetic layer 1 and the second ferromagnetic layer 2 shown in FIG. 1 include Heusler alloy layers. The first ferromagnetic layer 1 and the second ferromagnetic layer 2 are formed as, for example, Heusler alloy layers. At least a part of the Heusler alloy layers is crystallized. For example, all Heusler alloy layers may be crystallized.

Whether or not the Heusler alloy is crystallized is determined by a transmission electron microscope (TEM) image (for example, a high-angle scattering annular dark-field scanning transmission microscope image: HAADF-STEM image) or an electron diffraction image using a transmission electron beam. When the Heusler alloy is crystallized, it is possible to confirm a state in which atoms are regularly arranged, for example, on the HAADF-STEM image. More specifically, spots derived from the crystal structure of the Heusler alloy appear on the Fourier transform image of the HAADF-STEM image. Further, when the Heusler alloy is crystallized, diffraction spots from at least one of the (001) plane, the (002) plane, the (110) plane, and the (111) plane can be confirmed in the electron diffraction image. If crystallization can be confirmed by at least one of the means, it can be said that at least a part of the Heusler alloy is crystallized.

The Heusler alloy layer is, for example, mainly oriented (also referred to as preferentially oriented) in the (001) direction. The main orientation in the (001) direction means that the main crystal direction of the crystals constituting the Heusler alloy layer is the (001) direction. For example, when the Heusler alloy layer is composed of a plurality of crystal grains, the crystal direction of each crystal grain may be different. In this case, if the direction of the composite vector (the resultant vector) of the crystal orientation direction in each crystal grain is within the range of inclination within 25° with respect to the (001) direction, it can be said that the crystal is mainly oriented in the (001) direction. The crystallinity of the Heusler alloy layer in which the orientation directions of the constituent crystals are aligned is high and the MR ratio of the magnetoresistance effect element 10 of the Heusler alloy is high. Further, the orientation direction considered to be equivalent to the (001) direction is also included in the (001) orientation. That is, it is assumed that the (001) orientation includes (001) orientation, (010) orientation, (100) orientation, and all of the orientation directions opposite to these.

The Heusler alloys are intermetallic compounds with a chemical composition of XYZ or $X_2YZ$. The ferromagnetic Heusler alloy represented by $X_2YZ$ is referred to as a full Heusler alloy and the ferromagnetic Heusler alloy represented by XYZ is referred to as a half Heusler alloy. The half Heusler alloy is an empty lattice in which some of the X-site atoms of the full Heusler alloy are formed. Both are typically intermetallic compounds based on the bcc structure.

Figure 2A:
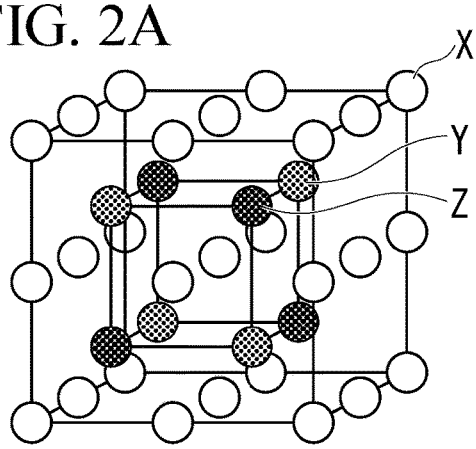
FIG. 2A is a diagram showing a crystal structure of a Heusler alloy and showing an $L2_1$ structure.
Figure 2D:
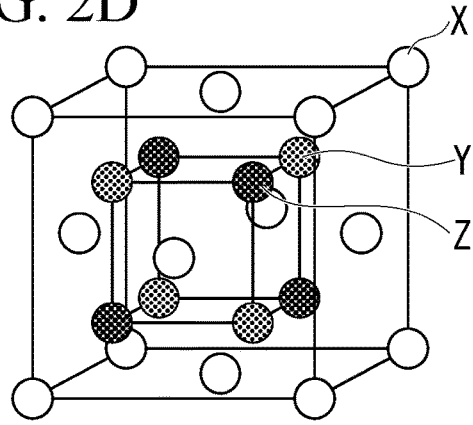
FIG. 2D is a diagram showing a crystal structure of a Heusler alloy and showing a $C1_b$ structure.
Figure 2B:
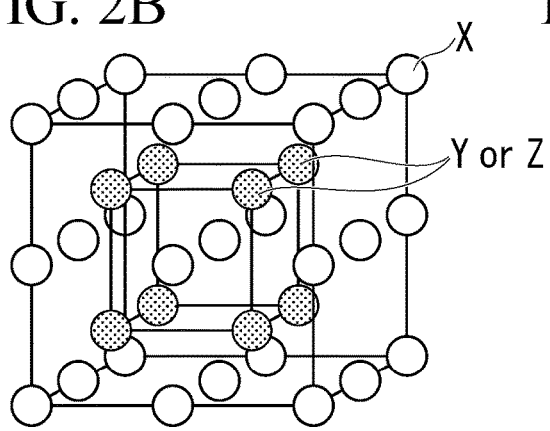
FIG. 2B is a diagram showing a crystal structure of a Heusler alloy and showing a B2 structure derived from the $L2_1$ structure.
Figure 2E:
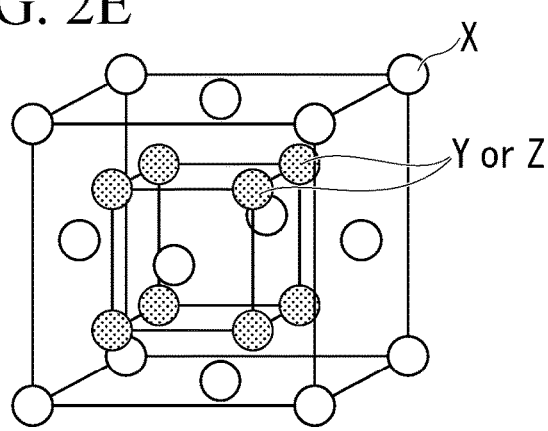
FIG. 2E is a diagram showing a crystal structure of a Heusler alloy and showing a B2 structure derived from the $C1_b$ structure.
Figure 2C:
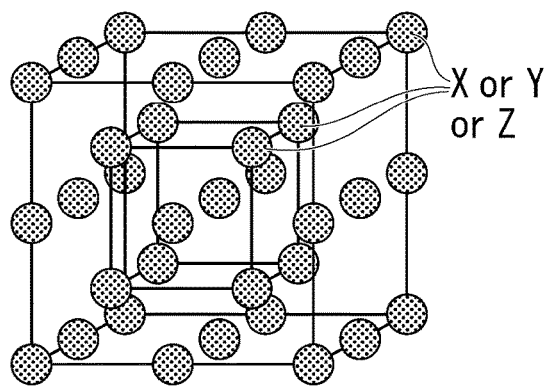
FIG. 2C is a diagram showing a crystal structure of a Heusler alloy and showing an A2 structure derived from the $L2_1$ structure.
Figure 2F:
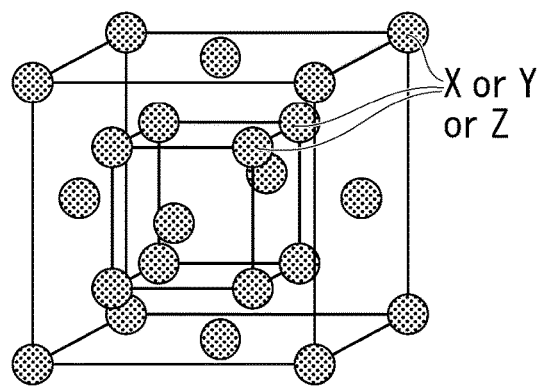
FIG. 2F is a diagram showing a crystal structure of a Heusler alloy and showing an A2 structure derived from the $C1_b$ structure.

FIGS. 2A to 2F are examples of the crystal structure of the Heusler alloy. FIGS. 2A to 2C are examples of the crystal structure of the full Heusler alloy and FIGS. 2D to 2F are examples of the crystal structure of the half Heusler alloy.

FIG. 2A is referred to as an $L2_1$ structure. In the $L2_1$ structure, the elements entering the X site, the elements entering the Y site, and the elements entering the Z site are fixed. FIG. 2B is referred to as a B2 structure derived from the $L2_1$ structure. In the B2 structure, the elements entering the Y site and the elements entering the Z site are mixed and the elements entering the X site are fixed. FIG. 2C is referred to as an A2 structure derived from the $L2_1$ structure. In the A2 structure, the elements entering the X site, the elements entering the Y site, and the elements entering the Z site are mixed.

FIG. 2D is referred to as a $C1_b$ structure. In the $C1_b$ structure, the elements entering the X site, the elements entering the Y site, and the elements entering the Z site are fixed. FIG. 2E is referred to as a B2 structure derived from the $C1_b$ structure. In the B2 structure, the elements entering the Y site and the elements entering the Z site are mixed, and the elements entering the X site is fixed. FIG. 2F is referred to as an A2 structure derived from the $C1_b$ structure. In the A2 structure, the elements entering the X site, the elements entering the Y site, and the elements entering the Z site are mixed.

The crystallinity becomes higher in order of $L2_1$ structure>B2 structure>A2 structure in the full Heusler alloy and the crystallinity becomes higher in order of $C1_b$ structure>B2 structure>A2 structure in the half Heusler alloy. Although these crystal structures differ in good crystallinity, they are all crystals. Thus, each of the first ferromagnetic layer 1 and the second ferromagnetic layer 2 has, for example, any one of the above-described crystal structures. The crystal structure of each of the first ferromagnetic layer 1 and the second ferromagnetic layer 2 is, for example, the $L2_1$ structure or the B2 structure.

Here, X is a transition metal element or a noble metal element of the Co, Fe, Ni, or Cu group on the periodic table, Y is a transition metal of the Mn, V, Cr, or Ti group or an element species of X, and Z is a typical element of groups III to V. Examples of the full Heusler alloy include $Co_2FeSi$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, and the like. Examples of the half Heusler alloy include NiMnSe, NiMnTe, NiMnSb, PtMnSb, PdMnSb, CoFeSb, NiFeSb, RhMnSb, CoMnSb, IrMnSb, and NiCrSb.

The composition of the Heusler alloy layer can be made using Energy Dispersive X-ray Analysis (EDS). Further, if the EDS ray analysis is performed, for example, the composition distribution of each material in the film thickness direction can be confirmed. Similarly, the composition of layers other than the Heusler alloy layer of the magnetoresistance effect element 10 can be evaluated using EDS.

The Heusler alloy contained in the Heusler alloy layer may be represented by, for example, $Co_2Y_\alpha Z_\beta$. Y is, for example, one or more elements selected from the group consisting of Fe, Mn, and Cr, Z is, for example, one or more elements selected from the group consisting of Si, Al, Ga, and Ge, and $\alpha+\beta>2$ is satisfied. Y is particularly preferably Fe and Z is particularly preferably Ga and Ge.

The full Heusler alloy with stoichiometric composition is represented by $Co_2YZ$. When $\alpha+\beta>2$ is satisfied, the Co composition ratio becomes relatively smaller than the total composition ratio of the elements at the Y site and the Z site. When the Co composition ratio is relatively smaller than the total composition ratio of the elements at the Y site and Z site, antisite in which the element at the Y site and Z site is replaced with the element at the X site (Co) can be avoided. Antisite fluctuates the Fermi level of the Heusler alloy. When the Fermi level fluctuates, the half metal property of the Heusler alloy decreases and the spin polarization decreases. A decrease in the spin polarization causes a decrease in the MR ratio of the magnetoresistance effect element 10.

The Heusler alloy contained in the Heusler alloy layer may be represented by, for example, $Co_2Fe_\alpha Ga_{\beta 1}Ge_{\beta 2}$. The composition formula may satisfy $\alpha+\beta 1+\beta 2 \geq 2.3$, $\alpha<\beta 1+\beta 2$, $0.5<\alpha<1.9$, $0.1 \leq \beta 1$, and $0.1 \leq \beta 2$.

The first non-magnetic layer 3 is sandwiched between the first ferromagnetic layer 1 and the second ferromagnetic layer 2. The first non-magnetic layer 3 is made of, for example, a nonmagnetic metal. The first non-magnetic layer 3 is, for example, a metal or alloy containing one or more element selected from the group consisting of Cu, Au, Ag, Al, and Cr. A metal or alloy containing these elements has excellent conductivity and lowers the area resistance (hereinafter referred to as RA) of the magnetoresistance effect element 10. The first non-magnetic layer 3 contains, for example, one or more element selected from the group consisting of Cu, Au, Ag, Al, and Cr as a main constituent element. The main constituent element means that the ratio of Cu, Au, Ag, Al, and Cr in the composition formula is 50% or more. The first non-magnetic layer 3 preferably contains Ag and preferably contains Ag as a main constituent element. Since Ag has a long spin diffusion length, the magnetoresistance effect element 10 using Ag exhibits a large MR ratio.

The thickness of the first non-magnetic layer 3 is, for example, in the range of 1 nm or more and 10 nm or less. The first non-magnetic layer 3 inhibits the magnetic bond between the first ferromagnetic layer 1 and the second ferromagnetic layer 2.

The first non-magnetic layer 3 may be an insulator or a semiconductor. The nonmagnetic insulator is, for example, $Al_2O_3$, $SiO_2$, MgO, $MgAl_2O_4$, and a material in which some of these Al, Si, and Mg are replaced with Zn, Be, and the like. These materials have a large bandgap and excellent insulation. When the first non-magnetic layer 3 is made of a nonmagnetic insulator, the first non-magnetic layer 3 is a tunnel barrier layer. Examples of the nonmagnetic semiconductor include Si, Ge, $CuInSe_2$, $CuGaSe_2$, Cu (In, Ga) See, and the like.

The second non-magnetic layer 4 is in contact with any surface of the Heusler alloy layer. The second non-magnetic layer 4 shown in FIG. 1 is in contact with the surfaces on the side of the first non-magnetic layer 3 in the first ferromagnetic layer 1 and the second ferromagnetic layer 2.

Figure 3:
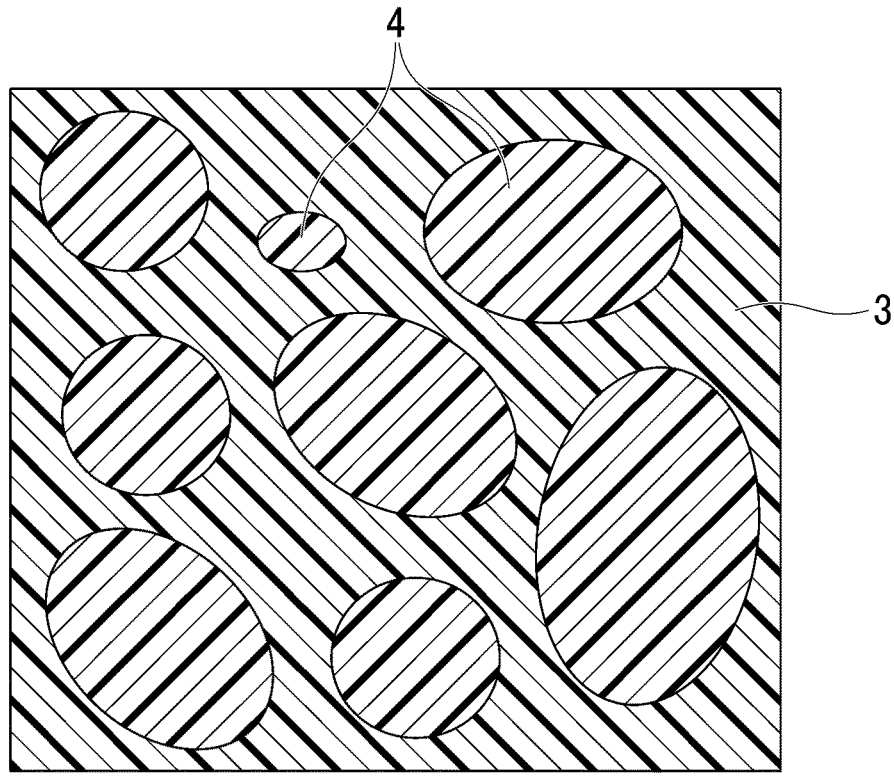
FIG. 3 is a cross-sectional view of the magnetoresistance effect element according to the first embodiment cut along a plane passing through a second non-magnetic layer in an in-plane direction.
Figure 4:
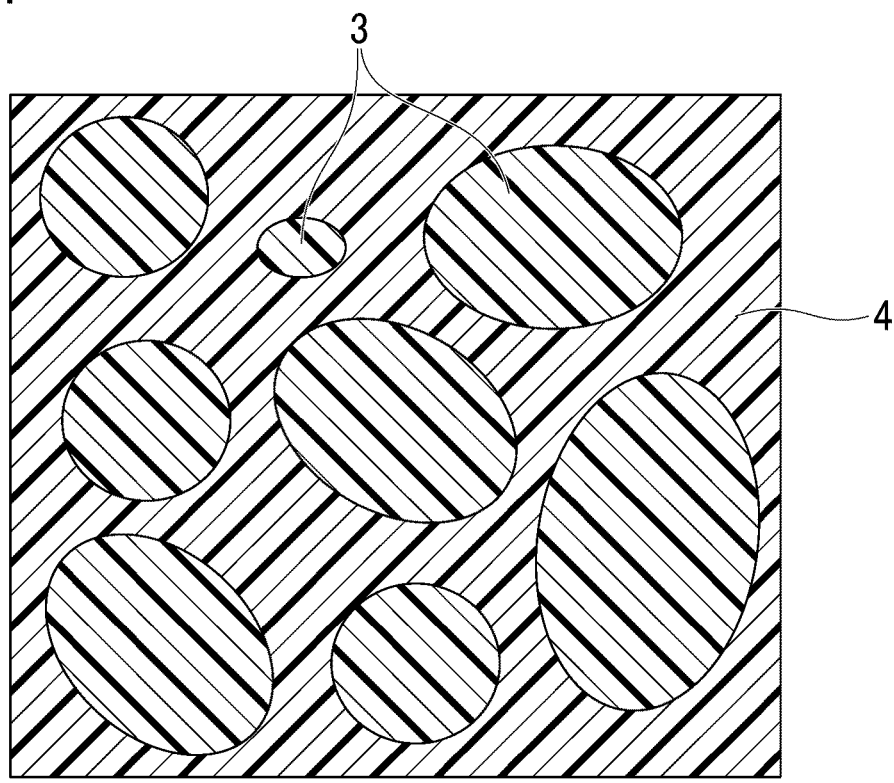
FIG. 4 is a cross-sectional view of another example of the magnetoresistance effect element according to the first embodiment cut along a plane passing through a second non-magnetic layer in an in-plane direction.

FIG. 3 is a cross-sectional view of the magnetoresistance effect element 10 according to the first embodiment cut along a plane passing through the second non-magnetic layer 4 in an in-plane direction. The second non-magnetic layer 4 has a discontinuous portion with respect to the lamination surface. The second non-magnetic layers 4 shown in FIG. 3 are scattered with respect to the lamination surface. In the case shown in FIG. 3, a portion in which the first non-magnetic layer 3 is present between the adjacent second non-magnetic layers 4 is a discontinuous portion. Further, the shape of the second non-magnetic layer 4 in a plan view is not limited to that of FIG. 3. FIG. 4 is a cross-sectional view of another example of the magnetoresistance effect element 10 according to the first embodiment cut along a plane passing through the second non-magnetic layer 4 in an in-plane direction. An opening is provided in a part of the second non-magnetic layer 4 shown in FIG. 4. The opening is filled with the first non-magnetic layer 3. In the case shown in FIG. 4, an opening portion of the second non-magnetic layer 4 in which the first non-magnetic layer 3 is present is a discontinuous portion. Since the second non-magnetic layer 4 has the discontinuous portion, the RA of the magnetoresistance effect element 10 decreases.

When the magnetoresistance effect element 10 is viewed from above in the lamination direction, an area ratio occupied by the second non-magnetic layer 4 in a surface provided with the second non-magnetic layer 4 is, for example, 10% or more and 80% or less and preferably 20% or more and 60% or less.

The area ratio can be measured by observing a surface on which the second non-magnetic layer 4 of the magnetoresistance effect element 10 is disposed using a scanning electron microscope (SEM), TEM, or the like in a plan view from the lamination direction.

The second non-magnetic layer 4 is made of a material different from that of the first non-magnetic layer 3. The second non-magnetic layer 4 is made of an oxide containing Mg. The oxide containing Mg has crystallinity and is oriented in a (001) direction. Examples of the oxide containing Mg include MgO and $MgAl_2O_4$. The oxide containing Mg is preferably MgO. MgO has high crystal self-orientation.

The second non-magnetic layer 4 may contain, for example, one or more element selected from the group consisting of Al, Ga, Ti, and Ni. These elements may be incorporated into a crystal structure or may be contained as additives. For example, MgO may contain these elements as additives. These elements lower the resistance of the second non-magnetic layer 4 and lowers the RA of the magnetoresistance effect element 10.

The thickness of the second non-magnetic layer 4 is, for example, 1 nm or less and 0.10 nm or more.

The magnetoresistance effect element 10 may include a layer other than the first ferromagnetic layer 1, the second ferromagnetic layer 2, the first non-magnetic layer 3, and the second non-magnetic layer 4 described above. For example, the magnetoresistance effect element may include an underlayer on a surface on the side opposite to the first non-magnetic layer 3 in the first ferromagnetic layer 1 and may include a cap layer on a surface on the side opposite to the first non-magnetic layer 3 in the second ferromagnetic layer 2. The underlayer and the cap layer enhance the crystal orientation of the first ferromagnetic layer 1 and the second ferromagnetic layer 2. The underlayer and the cap layer contain, for example, Ru, Ir, Ta, Ti, Al, Au, Ag, Pt, and Cu.

Figure 5:
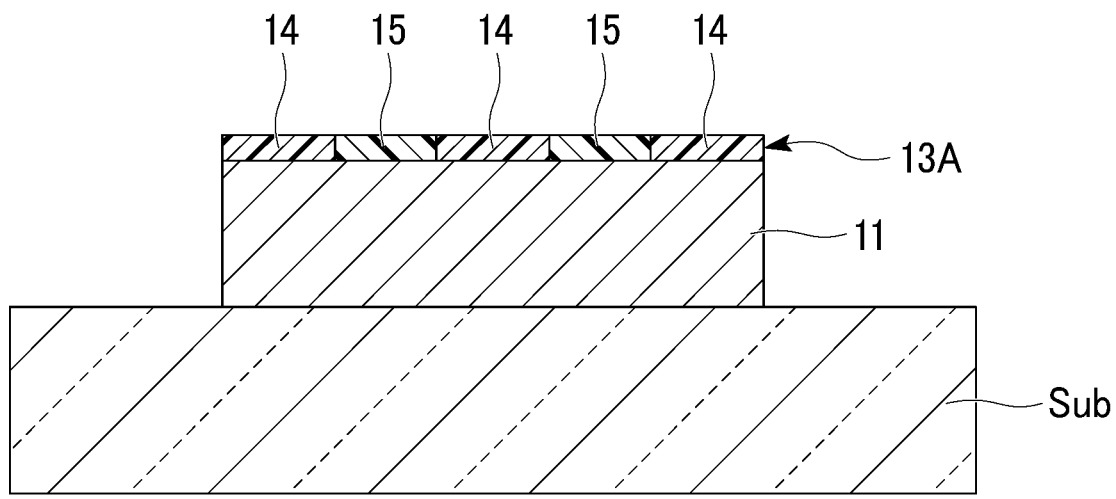
FIG. 5 is a cross-sectional view illustrating a method of manufacturing the magnetoresistance effect element according to the first embodiment.
Figure 6:
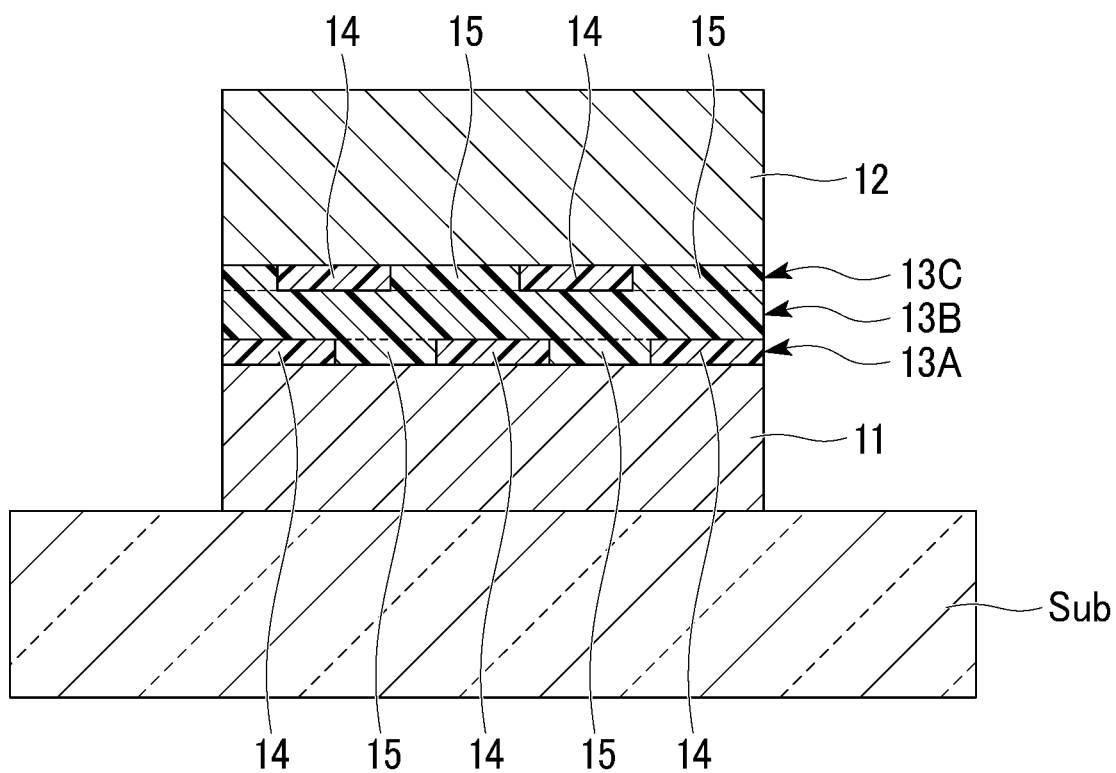
FIG. 6 is a cross-sectional view illustrating a method of manufacturing the magnetoresistance effect element according to the first embodiment.

Next, a method of manufacturing the magnetoresistance effect element 10 will be described. FIGS. 5 and 6 are schematic diagrams illustrating a method of manufacturing the magnetoresistance effect element 10 according to the first embodiment.

First, a substrate Sub which is an underlying for forming a film is prepared. The substrate Sub may be crystalline or amorphous. Examples of the crystalline substrate include a metal oxide single crystal, a silicon single crystal, and a sapphire single crystal. Examples of the amorphous substrate include silicon single crystal with a thermal oxide film, glass, ceramic, and quartz.

Next, the first ferromagnetic layer 11 and a first layer 13A are sequentially laminated on the substrate Sub. These layers are formed by, for example, a sputtering method. The first ferromagnetic layer 11 is made of the same material as that of the first ferromagnetic layer 1. The first ferromagnetic layer 11 is made of, for example, a Heusler alloy. The first layer 13A is, for example, an alloy of Mg and Ag and is formed by sputtering the alloy of Mg and Ag as a target.

After forming the first layer 13A, the first layer 13A is oxidized in a small amount of oxygen atmosphere. Mg which is easily oxidized among the elements constituting the first layer 13A is oxidized to MgO and Ag which is not easily oxidized remains unoxidized (precisely, it is oxidized, but remains substantially conductive). As a result, the first layer 13A is divided into a first region 14 and a second region 15. The first region 14 is MgO formed by oxidation and the second region 15 is, for example, unoxidized Ag. MgO constituting the first region 14 has high self-orientation and is a crystal oriented in the (001) direction.

The method of oxidation is not particularly limited. For example, the first layer 13A may be oxidized by introducing oxygen into a chamber, the first layer 13A may be oxidized by a plasma composed of a rare gas and oxygen, or the first layer 13A may be oxidized by irradiation with an ion beam.

Further, for example, MgO and Ag may be formed at the same time to directly form the first region 14. In this case, oxidation can be omitted.

Next, a second layer 13B and a third layer 13C are formed on the first layer 13A. These layers are formed by, for example, a sputtering method. The second layer 13B is composed of, for example, Ag. The third layer 13C is, for example, an alloy of Mg and Ag and is formed by sputtering the alloy of Mg and Ag as a target.

After forming the third layer 13C, the third layer 13C is oxidized in an oxygen atmosphere similarly to the first layer 13A. The third layer 13C is divided into a first region 14 and a second region 15 similarly to the first layer 13A. The first region 14 is MgO which is formed by oxidation and the second region 15 is Ag which has not been oxidized or has a weak degree of oxidation. MgO constituting the first region 14 has high self-orientation and is a crystal oriented in the (001) direction.

Next, the second ferromagnetic layer 12 is laminated on the third layer 13C. The second ferromagnetic layer 12 is made of the same material as that of the second ferromagnetic layer 2. The second ferromagnetic layer 12 is made of, for example, a Heusler alloy. The second ferromagnetic layer 12 is formed by, for example, a sputtering method.

Next, a laminate laminated on the substrate Sub is annealed. The annealing temperature is, for example, 300° C. or less and is, for example, 250° C. or more and 300° C. or less.

When the laminate is annealed, the first ferromagnetic layer 11 and the second ferromagnetic layer 12 are crystallized. The reason why the first ferromagnetic layer 11 and the second ferromagnetic layer 12 are crystallized even at a low annealing temperature is because the first region 14 is present. The first region 14 has self-orientation and is crystallized. When the atoms of the first ferromagnetic layer 11 and the second ferromagnetic layer 12 are rearranged by annealing, the atoms constituting the first ferromagnetic layer 11 and the second ferromagnetic layer 12 are arranged by the influence of the arrangement of the crystals of the adjacent first regions 14. Therefore, the regular arrangement of the first ferromagnetic layer 11 and the second ferromagnetic layer 12 is prompted and the first ferromagnetic layer 11 and the second ferromagnetic layer 12 are crystallized even at a low temperature.

As described above, the first ferromagnetic layer 11 and the second ferromagnetic layer 12 are crystallized to become the first ferromagnetic layer 1 and the second ferromagnetic layer 2, the second layer 13B and the second region 15 become the first non-magnetic layer 3, and the first region 14 becomes the second non-magnetic layer 4. As a result, the magnetoresistance effect element 10 shown in FIG. 1 can be obtained.

In the above-described example, the first region 14 and the second region 15 are formed by using a difference in the ease of oxidation of the constituting material, but these regions may be formed by using a photolithography technique.

As described above, when the method of manufacturing the magnetoresistance effect element 10 according to this embodiment is used, the Heusler alloy can be crystallized regardless of the base crystal structure. Here, although the above-described method has been introduced as one of the process of the method of manufacturing the magnetoresistance effect element 10, the above-described method can also be applied to the method of crystallizing a single ferromagnetic layer. For example, a Heusler alloy having crystallinity can be obtained by laminating an oxide film having self-orientation on a Heusler alloy layer and heating these.

In the method of manufacturing the magnetoresistance effect element 10 according to this embodiment, the first ferromagnetic layer 1 and the second ferromagnetic layer 2 are crystallized at a low temperature of 300° C. or less. If the temperature is 300° C. or less, it is possible to reduce an adverse effect on other components (for example, a magnetic shield) even when annealing is performed, for example, after manufacturing the other components of the magnetic head. Thus, the annealing timing is not limited and the manufacturing of elements such as a magnetic head is facilitated.

Further, in the magnetoresistance effect element 10 according to this embodiment, the first ferromagnetic layer 1 and the second ferromagnetic layer 2 sandwiching the first non-magnetic layer 3 are crystallized. Therefore, the first ferromagnetic layer 1 and the second ferromagnetic layer 2 exhibit high spin polarization. As a result, the magnetoresistance effect element 10 according to this embodiment has a large MR ratio.

Further, in the magnetoresistance effect element 10 according to this embodiment, a discontinuous portion is provided in a part of the second non-magnetic layer 4. When the second non-magnetic layer 4 is present on the whole lamination surface, the RA of the magnetoresistance effect element 10 increases. Since a part of the second non-magnetic layer 4 is discontinuous, the RA of the magnetoresistance effect element 10 decreases.

Although the embodiments of the present disclosure have been described with reference to the drawings, each configuration and a combination thereof in each embodiment are examples and the configuration can be added, omitted, replaced, and modified into other forms without departing from the spirit of the present disclosure.

Figure 7:
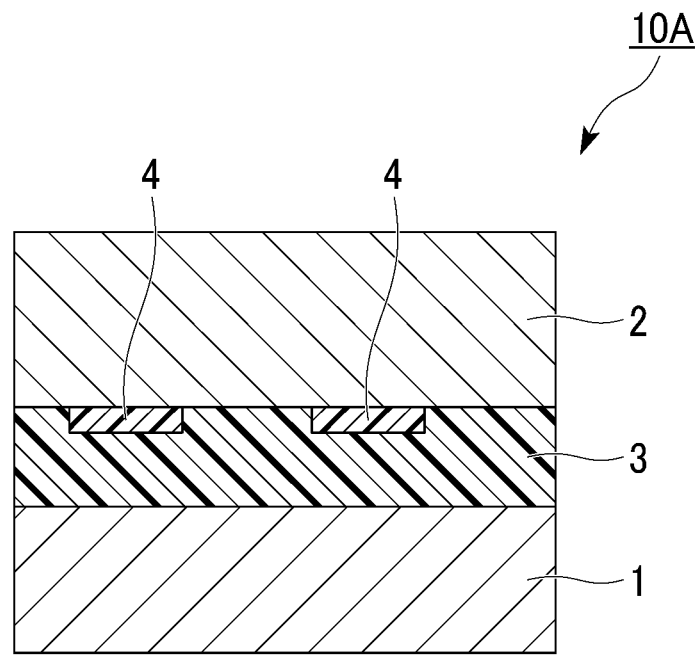
FIG. 7 is a cross-sectional view of a magnetoresistance effect element according to a first modified example of the first embodiment.

For example, FIG. 7 is a cross-sectional view of a magnetoresistance effect element 10A according to a first modified example. In the magnetoresistance effect element 10A shown in FIG. 7, the second non-magnetic layer 4 is in contact with only the second ferromagnetic layer 2. FIG. 7 shows an example in which the second non-magnetic layer 4 is in contact with only the second ferromagnetic layer 2, but the second non-magnetic layer 4 may be in contact with only the first ferromagnetic layer 1. In this case, the ferromagnetic layer which is not in contact with the second non-magnetic layer 4 may be made of, for example, a metal selected from the group consisting of Cr, Mn, Co, Fe, and Ni, an alloy containing one or more of these metals, an alloy containing at least one element of B, C, and N and these metals, or a Heusler alloy. For example, the composition of the ferromagnetic layer which is not in contact with the second non-magnetic layer 4 is Co—Fe and Co—Fe—B.

Figure 8:
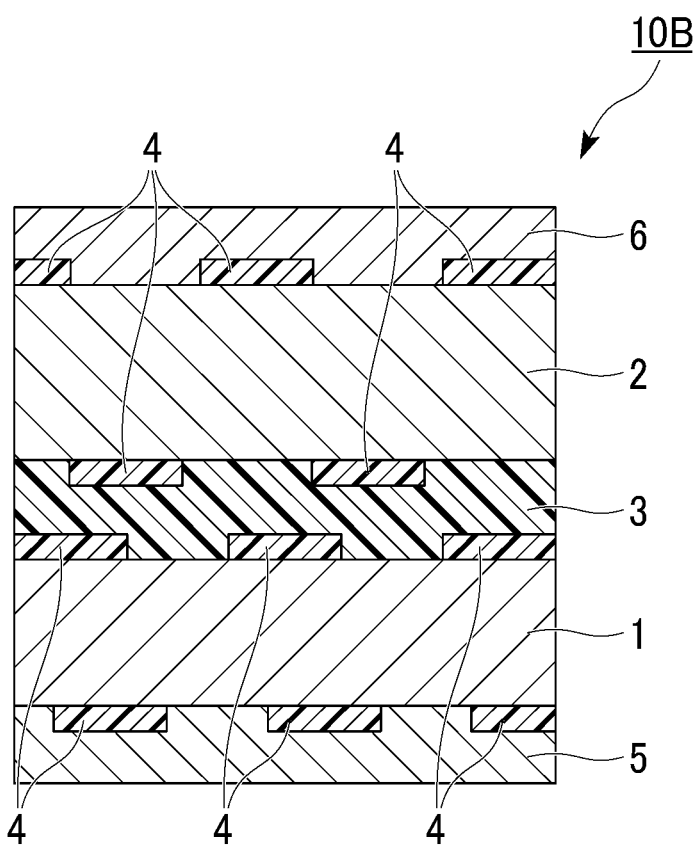
FIG. 8 is a cross-sectional view of a magnetoresistance effect element according to a second modified example of the first embodiment.

Further, for example, FIG. 8 is a cross-sectional view of a magnetoresistance effect element 10B according to a second modified example. FIG. 8 shows an underlayer 5 and a cap layer 6 at the same time. In the magnetoresistance effect element 10B shown in FIG. 8, the second non-magnetic layer 4 is in contact with both surfaces of each of the first ferromagnetic layer 1 and the second ferromagnetic layer 2. When the second non-magnetic layer 4 is in contact with both surfaces of the first ferromagnetic layer 1 and the second ferromagnetic layer 2, the crystallization of the first ferromagnetic layer 1 and the second ferromagnetic layer 2 proceeds at the time of annealing and the crystallinity of the first ferromagnetic layer 1 and the second ferromagnetic layer 2 is improved.

Figure 9:
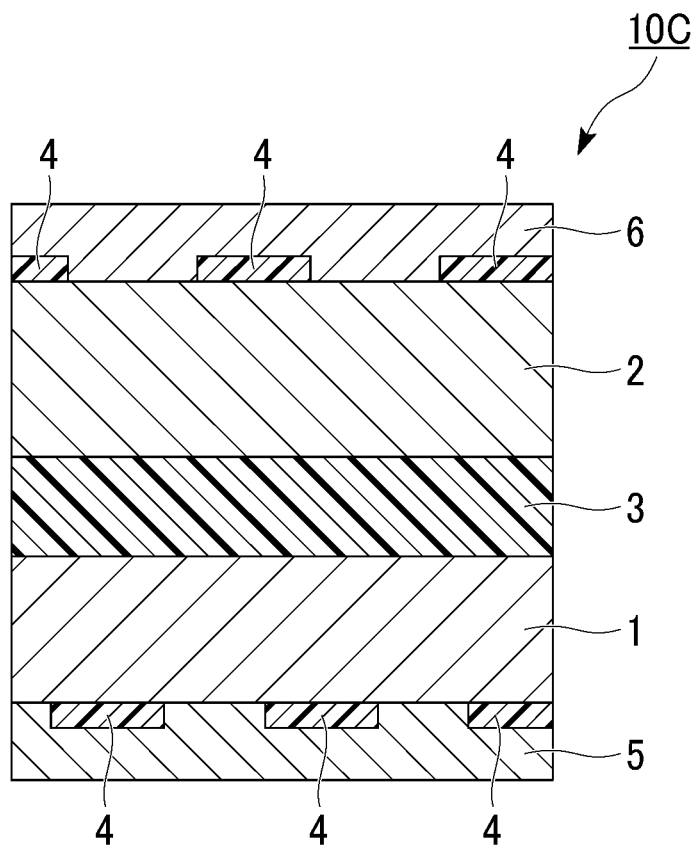
FIG. 9 is a cross-sectional view of a magnetoresistance effect element according to a third modified example of the first embodiment.

Further, for example, FIG. 9 is a cross-sectional view of a magnetoresistance effect element 10C according to a third modified example. FIG. 9 shows the underlayer 5 and the cap layer 6 at the same time. In the magnetoresistance effect element 10C shown in FIG. 9, the second non-magnetic layer 4 is formed on a surface on the side opposite to a surface which is in contact with the first non-magnetic layer 3 in the first ferromagnetic layer 1 and the second ferromagnetic layer 2.

Although the first modified example to the third modified example have been described above, these are merely examples of the magnetoresistance effect element according to this embodiment. For example, the characteristic configurations of the first modified example to the third modified example may be combined with each other.

The above-described magnetoresistance effect elements 10, 10A, 10B, and 10C can be used for various applications. The magnetoresistance effect elements 10, 10A, 10B, and 10C can be applied to, for example, a magnetic head, a magnetic sensor, a magnetic memory, a high-frequency filter, and the like.

Next, application examples of the magnetoresistance effect element according to this embodiment will be described. Additionally, in the following application examples, the magnetoresistance effect element 10 is used, but the magnetoresistance effect element is not limited thereto.

Figure 10:
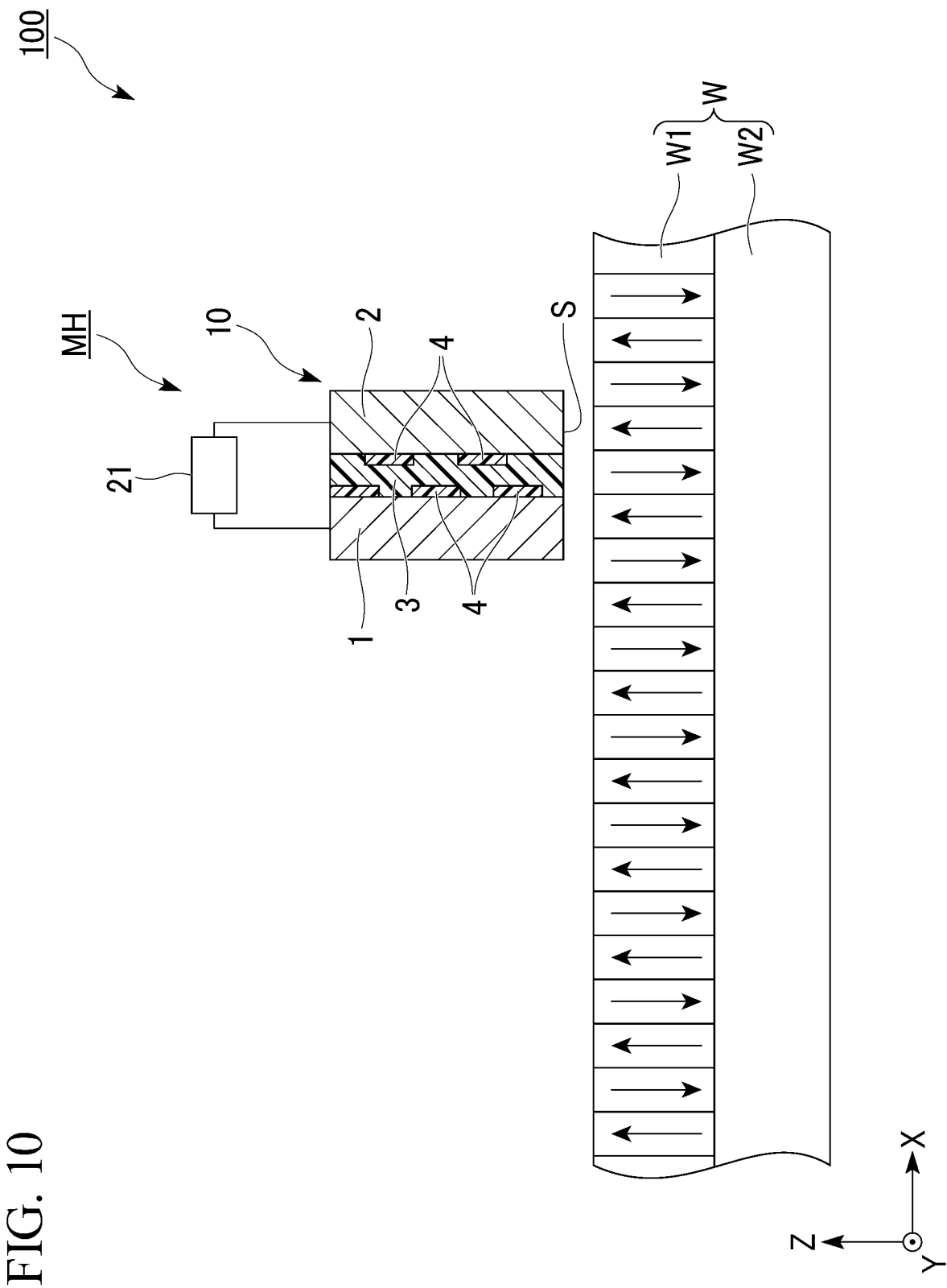
FIG. 10 is a cross-sectional view of a magnetic recording element according to Application Example 1.

FIG. 10 is a cross-sectional view of a magnetic recording element 100 according to Application Example 1. FIG. 10 is a cross-sectional view of the magnetoresistance effect element 10 cut along the lamination direction.

As shown in FIG. 10, the magnetic recording element 100 includes a magnetic head MH and a magnetic recording medium W. In FIG. 10, one extension direction of the magnetic recording medium W is set as an X direction and a direction perpendicular to the X direction is set as a Y direction. An XY plane is parallel to a main surface of the magnetic recording medium W. A direction connecting the magnetic recording medium W and the magnetic head MH and perpendicular to the XY plane is set as a Z direction.

In the magnetic head MH, an air bearing surface (a medium facing surface) S faces a surface of the magnetic recording medium W. The magnetic head MH moves in the directions of an arrow +X and an arrow −X along the surface of the magnetic recording medium W at a position separated from the magnetic recording medium W by a fixed distance. The magnetic head MH includes the magnetoresistance effect element 10 which acts as a magnetic sensor and a magnetic recording part (not shown). A resistance measuring device 21 measures a resistance value of the magnetoresistance effect element 10 in the lamination direction.

The magnetic recording part applies a magnetic field to the recording layer W1 of the magnetic recording medium W and determines the magnetization direction of the recording layer W1. That is, the magnetic recording part performs magnetic recording of the magnetic recording medium W. The magnetoresistance effect element 10 reads information of the magnetization of the recording layer W1 written by the magnetic recording part.

The magnetic recording medium W includes a recording layer W1 and a backing layer W2. The recording layer W1 is a portion that performs magnetic recording and the backing layer W2 is a magnetic path (magnetic flux passage) that recirculates the magnetic flux for writing to the magnetic head MH. The recording layer W1 records magnetic information as the magnetization direction.

The second ferromagnetic layer 2 of the magnetoresistance effect element 10 is, for example, a magnetization free layer. Therefore, the second ferromagnetic layer 2 exposed to the air bearing surface S is influenced by the magnetization recoded on the recording layer W1 of the facing magnetic recording medium W. For example, in FIG. 10, the second ferromagnetic layer 2 is influenced by the magnetization directed in the +z direction of the recording layer W1 and the magnetization direction of the second ferromagnetic layer 2 is directed to the +z direction. In this case, the magnetization directions of the first ferromagnetic layer 1 and the second ferromagnetic layer 2 which are magnetization fixed layers are parallel to each other.

Here, a resistance when the magnetization directions of the first ferromagnetic layer 1 and the second ferromagnetic layer 2 are parallel to each other is different from a resistance when the magnetization directions of the first ferromagnetic layer 1 and the second ferromagnetic layer 2 are antiparallel to each other. As a difference between the resistance value in the parallel case and the resistance value in the antiparallel case increases, the MR ratio of the magnetoresistance effect element 10 increases. The magnetoresistance effect element 10 of this embodiment contains a crystallized Heusler alloy and has a large MR ratio. Thus, it is possible to accurately read the information of magnetization of the recording layer W1 as the resistance value change by the resistance measuring device 21.

The shape of the magnetoresistance effect element 10 of the magnetic head MH is not particularly limited. For example, in order to avoid the influence of a leakage magnetic field of the magnetic recording medium W with respect to the first ferromagnetic layer 1 of the magnetoresistance effect element 10, the first ferromagnetic layer 1 may be installed at a position separated from the magnetic recording medium W.

Figure 11:
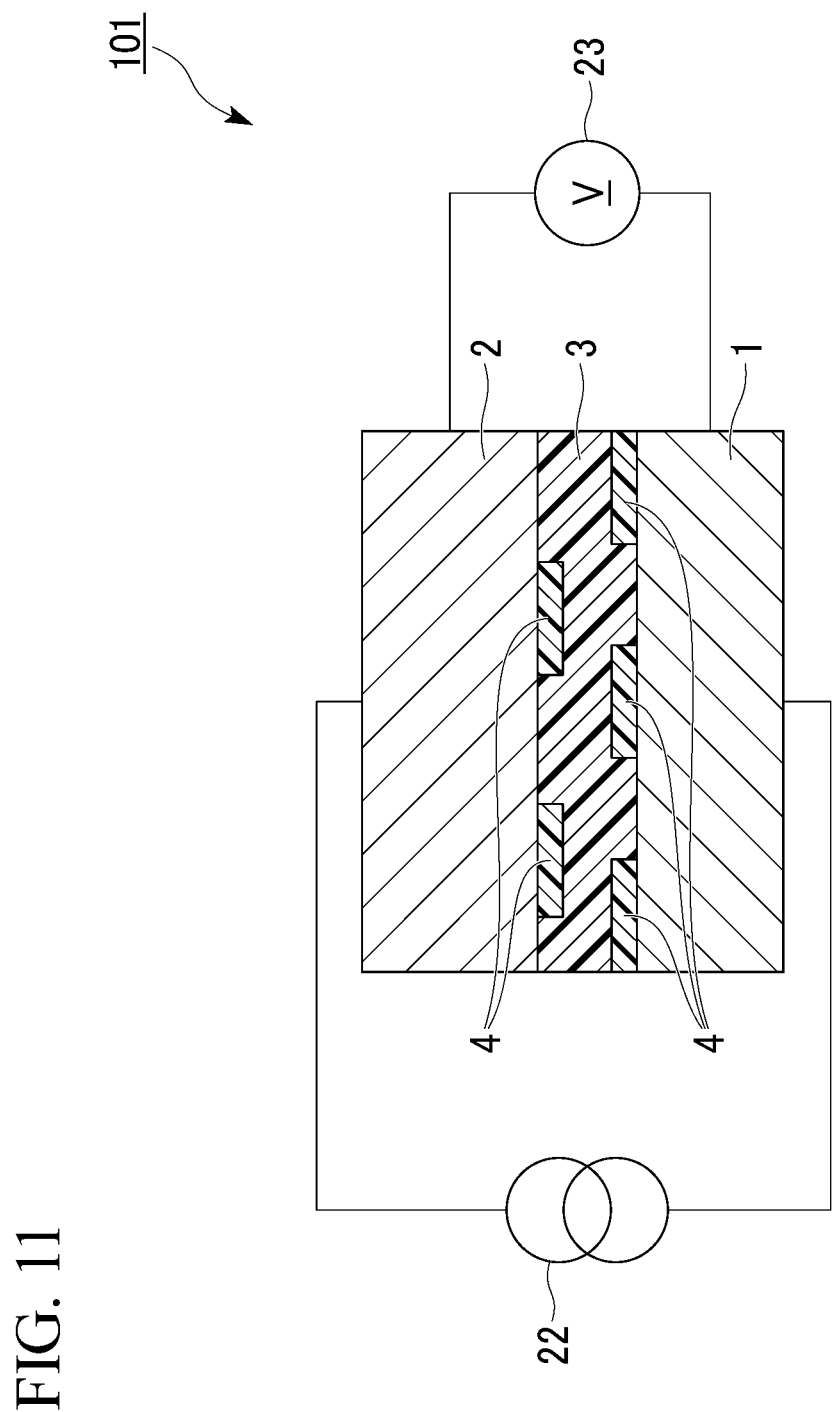
FIG. 11 is a cross-sectional view of a magnetic recording element according to Application Example 2.

FIG. 11 is a cross-sectional view of a magnetic recording element 101 according to Application Example 2. FIG. 11 is a cross-sectional view of the magnetic recording element 101 cut along the lamination direction.

As shown in FIG. 11, the magnetic recording element 101 includes the magnetoresistance effect element 10, a power source 22, and a measurement unit 23. The power source 22 gives a potential difference in the lamination direction of the magnetoresistance effect element 10. The power source 22 is, for example, a DC power supply. The measurement unit 23 measures the resistance value of the magnetoresistance effect element 10 in the lamination direction.

When a potential difference is generated between the first ferromagnetic layer 1 and the second ferromagnetic layer 2 by the power source 22, a current flows in the lamination direction of the magnetoresistance effect element 10. The current is spin-polarized when passing through the first ferromagnetic layer 1 and becomes a spin-polarized current. The spin-polarized current flows to the second ferromagnetic layer 2 via the first non-magnetic layer 3 and the second non-magnetic layer 4. The magnetization of the second ferromagnetic layer 2 is reversed by the influence of spin transfer torque (STT) caused by the spin-polarized current. As the relative angle between the magnetization direction of the first ferromagnetic layer 1 and the magnetization direction of the second ferromagnetic layer 2 changes, the resistance value of the magnetoresistance effect element 10 in the lamination direction changes. The resistance value of the magnetoresistance effect element 10 in the lamination direction is read by the measurement unit 23. That is, the magnetic recording element 101 shown in FIG. 11 is a spin transfer torque (STT) type magnetic recording element.

Since the magnetic recording element 101 shown in FIG. 11 includes the magnetoresistance effect element 10 which contains a crystallized Heusler alloy and has a large MR ratio, data can be accurately recoded.

Figure 12:
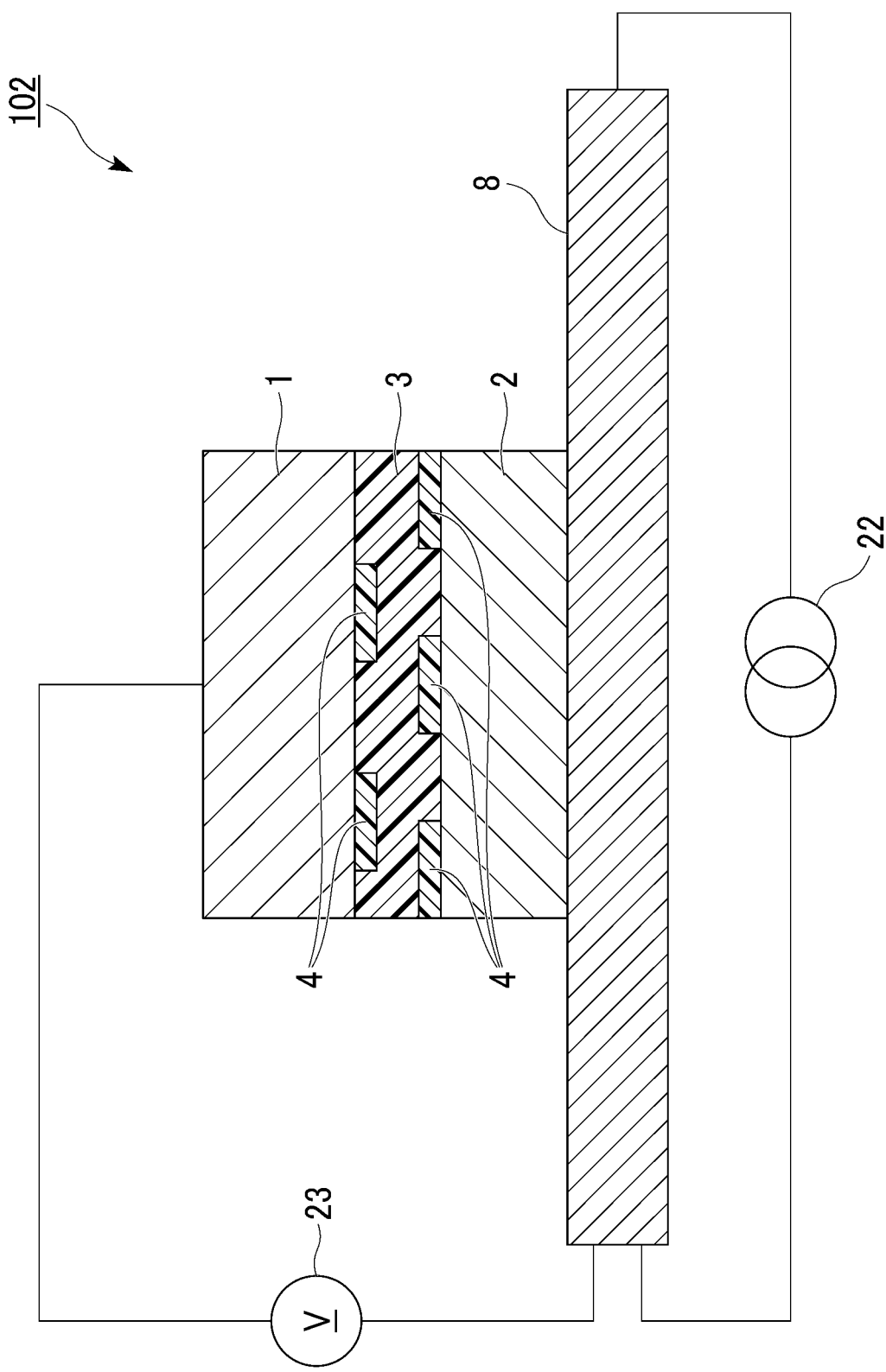
FIG. 12 is a cross-sectional view of a magnetic recording element according to Application Example 3.

FIG. 12 is a cross-sectional view of a magnetic recording element 102 according to Application Example 3. FIG. 12 is a cross-sectional view of the magnetic recording element 102 cut along the lamination direction.

As shown in FIG. 12, the magnetic recording element 102 includes the magnetoresistance effect element 10, a spin-orbit torque wiring 8, a power source 22, and a measurement unit 23. The spin-orbit torque wiring 8 is in contact with, for example, the second ferromagnetic layer 2. The spin-orbit torque wiring 8 extends toward one side of an in-plane direction. The power source 22 is connected to a first end and a second end of the spin-orbit torque wiring 8. The first end and the second end sandwich the magnetoresistance effect element 10 in a plan view. The power source 22 allows a writing current to flow through the spin-orbit torque wiring 8. The measurement unit 23 measures the resistance value of the magnetoresistance effect element 10 in the lamination direction.

When a potential difference is generated between the first end and the second end of the spin-orbit torque wiring 8 by the power source 22, a current flows in an in-plane direction of the spin-orbit torque wiring 8. The spin-orbit torque wiring 8 has a function of generating a spin current due to the spin Hall effect caused when a current flows. The spin-orbit torque wiring 8 contains, for example, any one of a metal, an alloy, an intermetallic compound, a metal boride, a metal carbide, a metal silicate, and a metal phosphate having a function of generating a spin current due to a spin Hall effect caused when a current flows. For example, the wiring contains a nonmagnetic metal having an atomic number of 39 or more having d-electrons or f-electrons in the outermost shell.

When a current flows in an in-plane direction of the spin-orbit torque wiring 8, the spin-orbit interaction produces a spin Hall effect. The spin Hall effect is a phenomenon in which a moving spin is bent in a direction orthogonal to the current flow direction. The spin Hall effect generates an uneven distribution of spins in the spin-orbit torque wiring 8 and induces a spin current in the thickness direction of the spin-orbit torque wiring 8. The spin is injected from the spin-orbit torque wiring 8 into the second ferromagnetic layer 2 due to a spin current.

The spin injected into the second ferromagnetic layer 2 gives spin-orbit torque (SOT) to the magnetization of the second ferromagnetic layer 2. The magnetization of the second ferromagnetic layer 2 is reversed by receiving the spin-orbit torque (SOT). As the relative angle between the magnetization direction of the first ferromagnetic layer 1 and the magnetization direction of the second ferromagnetic layer 2 changes, the resistance value of the magnetoresistance effect element 10 in the lamination direction changes. The resistance value of the magnetoresistance effect element 10 in the lamination direction is read by the measurement unit 23. That is, the magnetic recording element 102 shown in FIG. 12 is a spin-orbit torque (SOT) type magnetic recording element.

Since the magnetic recording element 102 shown in FIG. 12 includes the magnetoresistance effect element 10 containing a crystallized Heusler alloy and has a large MR ratio, data can be accurately recorded.

Figure 13:
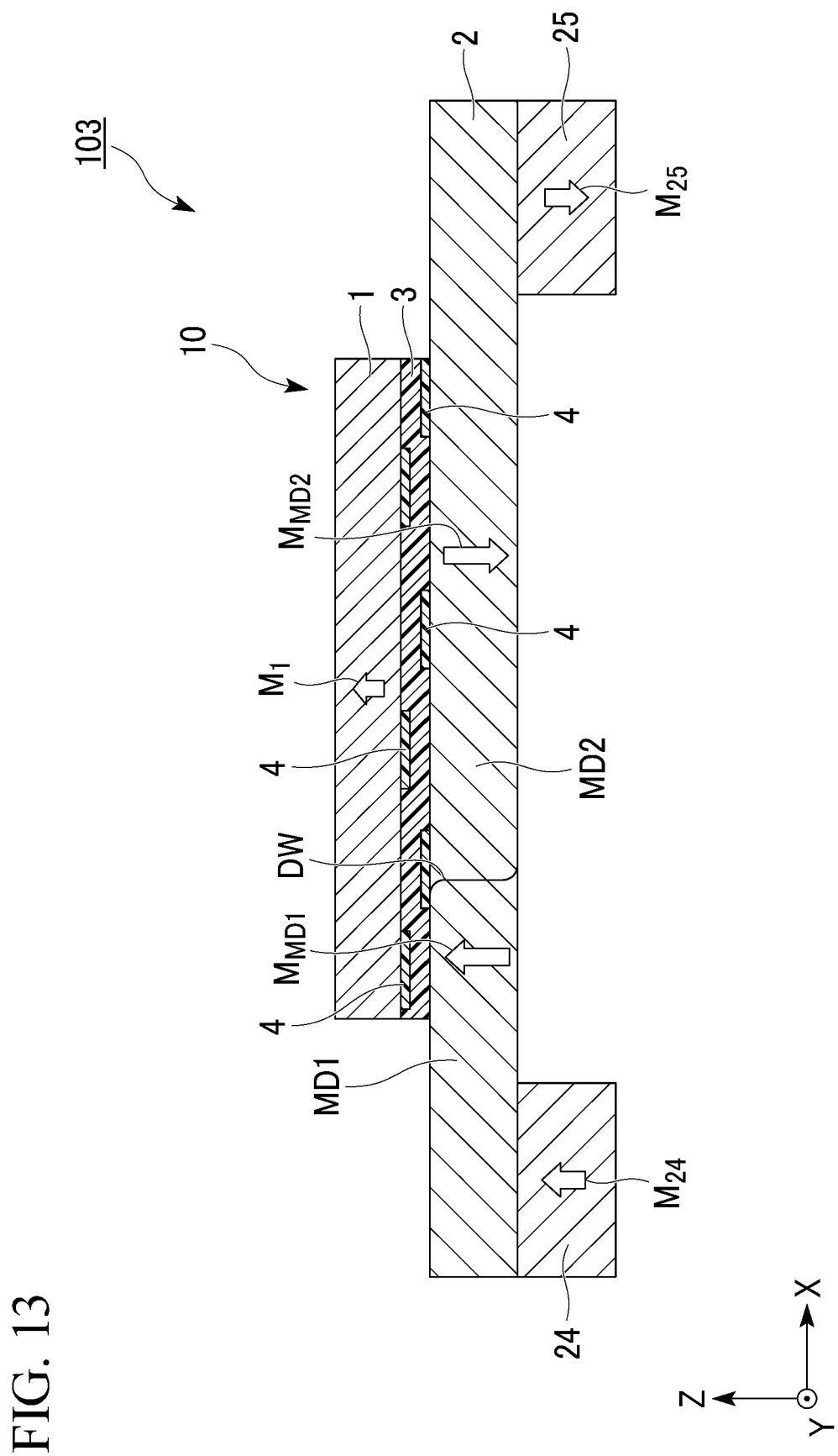
FIG. 13 is a cross-sectional view of a magnetic domain wall movement element according to Application Example 4.

FIG. 13 is a cross-sectional view of a magnetic domain wall movement element (a magnetic domain wall displacement type magnetic recording element) according to Application Example 4. A magnetic domain wall movement element 103 includes the magnetoresistance effect element 10, a first magnetization fixed layer 24, and a second magnetization fixed layer 25. The magnetoresistance effect element 10 includes the first ferromagnetic layer 1, the second ferromagnetic layer 2, the first non-magnetic layer 3, and the second non-magnetic layer 4. In FIG. 13, an extension direction of the first ferromagnetic layer 1 is set as an X direction, a direction perpendicular to the X direction is set as a Y direction, and a direction perpendicular to an XY plane is set as a Z direction.

The first magnetization fixed layer 24 and the second magnetization fixed layer 25 are connected to the first end and the second end of the second ferromagnetic layer 2. The first end and the second end sandwich the first ferromagnetic layer 1 and the first non-magnetic layer 3 in the X direction.

The second ferromagnetic layer 2 is a layer capable of magnetically recording information by changing an internal magnetic state. The second ferromagnetic layer 2 includes a first magnetic domain MD1 and a second magnetic domain MD2 therein. The magnetization at a position overlapping the first magnetization fixed layer 24 or the second magnetization fixed layer 25 of the second ferromagnetic layer 2 in the Z direction is fixed to one direction. The magnetization at a position overlapping the first magnetization fixed layer 24 in the Z direction is fixed to, for example, the +Z direction and the magnetization at a position overlapping the second magnetization fixed layer 25 in the Z direction is fixed to, for example, the −Z direction. As a result, a magnetic domain wall DW is formed in a boundary between the first magnetic domain MD1 and the second magnetic domain MD2. The second ferromagnetic layer 2 can have the magnetic domain wall DW therein. In the second ferromagnetic layer 2 shown in FIG. 13, the magnetization $M_{MD1}$ of the first magnetic domain MD1 is oriented in the +Z direction and the magnetization $M_{MD2}$ of the second magnetic domain MD2 is oriented in the −Z direction.

The magnetic domain wall movement element 103 can record data in multiple values or continuously depending on the position of the domain wall DW of the second ferromagnetic layer 2. Data recorded in the second ferromagnetic layer 2 is read as the resistance value change of the magnetic domain wall movement element 103 when a reading current is applied.

The ratio of the first magnetic domain MD1 and the second magnetic domain MD2 in the second ferromagnetic layer 2 changes as the magnetic domain wall DW moves. For example, the magnetization $M_1$ of the first ferromagnetic layer 1 is the same direction (parallel) as the magnetization $M_{MD1}$ of the first magnetic domain MD1 and is the opposite direction (antiparallel) to the magnetization $M_{MD2}$ of the second magnetic domain MD2. When the magnetic domain wall DW moves in the +X direction so that the area of the first magnetic domain MD1 in a portion overlapping the first ferromagnetic layer 1 in a plan view from the z direction becomes wide, the resistance value of the magnetic domain wall movement element 103 decreases. In contrast, when the magnetic domain wall DW moves in the −X direction so that the area of the second magnetic domain MD2 in a portion overlapping the first ferromagnetic layer 1 in a plan view from the Z direction becomes wide, the resistance value of the magnetic domain wall movement element 103 increases.

The magnetic domain wall DW moves when a writing current flows in the X direction of the second ferromagnetic layer 2 or an external magnetic field is applied. For example, since electrons flow in the −X direction opposite to that of the current when a writing current (for example, a current pulse) is applied in the +X direction of the second ferromagnetic layer 2, the magnetic domain wall DW moves in the −X direction. When a current flows from the first magnetic domain MD1 toward the second magnetic domain MD2, electrons which are spin-polarized by the second magnetic domain MD2 reverse the magnetization $M_{MD1}$ of the first magnetic domain MD1. Since the magnetization MMDI of the first magnetic domain MD1 is reversed, the magnetic domain wall DW moves in the −X direction.

Since the magnetic domain wall movement element 103 shown in FIG. 13 includes the magnetoresistance effect element 10 containing a crystallized Heusler alloy and having a large MR ratio, data can be accurately recorded.

Figure 14:
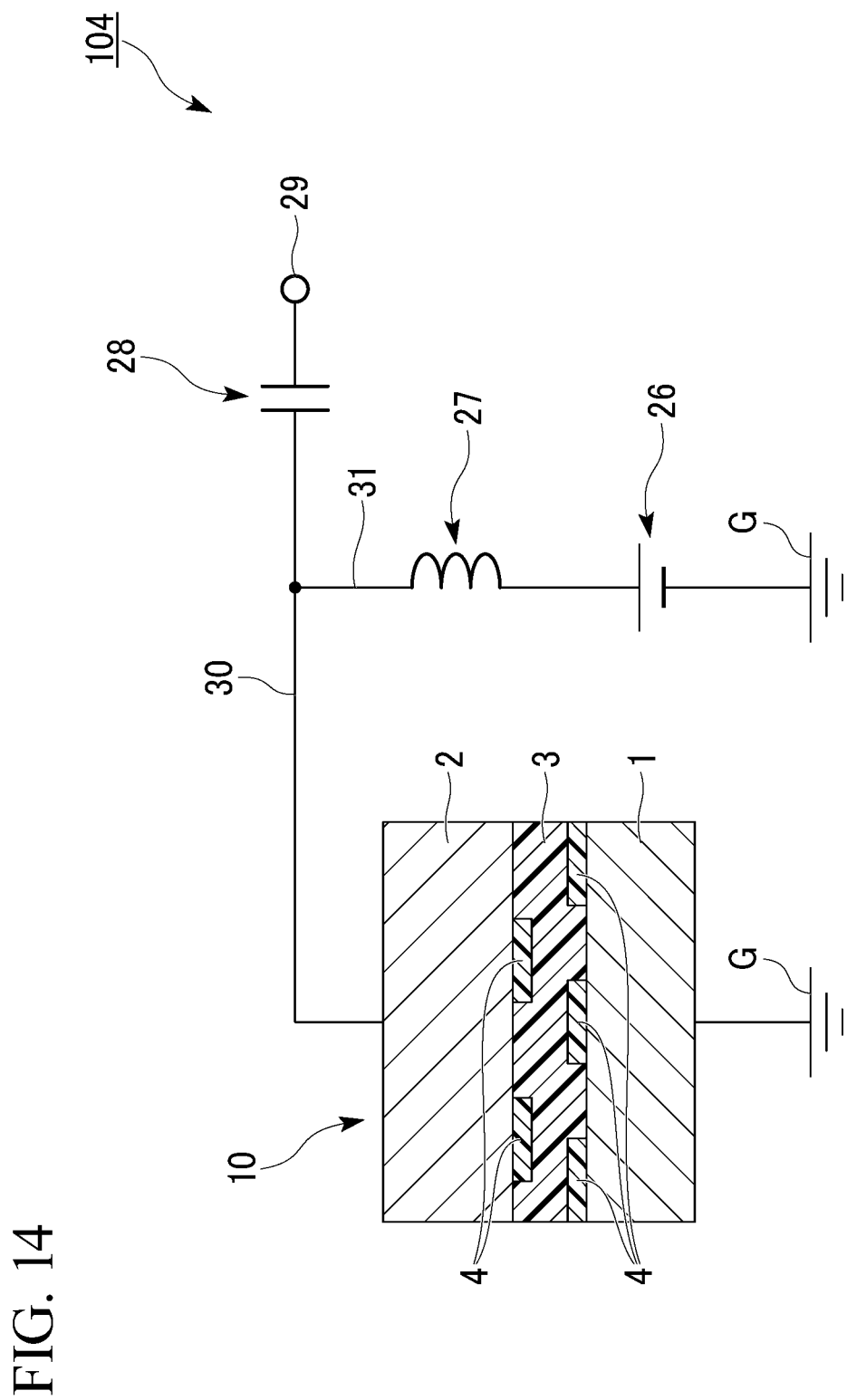
FIG. 14 is a cross-sectional view of a high-frequency device according to Application Example 5.

FIG. 14 is a schematic diagram of a high-frequency device 104 according to Application Example 5. As shown in FIG. 14, the high-frequency device 104 includes the magnetoresistance effect element 10, a DC power supply 26, an inductor 27, a capacitor 28, an output port 29, and wirings 30 and 31.

The wiring 30 connects the magnetoresistance effect element 10 to the output port 29. The wiring 31 branches from the wiring 30 and reaches a ground G via the inductor 27 and the DC power supply 26. The DC power supply 26, the inductor 27, and the capacitor 28 having known configurations can be used. The inductor 27 cuts a high-frequency component of the current and passes an invariant component of the current. The capacitor 28 passes a high-frequency component of the current and cuts an invariant component of the current. The inductor 27 is disposed at a portion where the flow of the high-frequency current needs to be suppressed and the capacitor 28 is disposed at a portion where the flow of the direct current needs to be suppressed.

When an alternating current or an alternating magnetic field is applied to the ferromagnetic layer included in the magnetoresistance effect element 10, the magnetization of the second ferromagnetic layer 2 undergoes an aging motion. The magnetization of the second ferromagnetic layer 2 vibrates strongly when the frequency of the high-frequency current or high-frequency magnetic field applied to the second ferromagnetic layer 2 is close to the ferromagnetic resonance frequency of the second ferromagnetic layer 2 and does not vibrate much at frequencies away from the ferromagnetic resonance frequency of the second ferromagnetic layer 2. This phenomenon is called a ferromagnetic resonance phenomenon.

The resistance value of the magnetoresistance effect element 10 changes due to the vibration of the magnetization of the second ferromagnetic layer 2. The DC power supply 26 applies a direct current to the magnetoresistance effect element 10. The direct current flows in the lamination direction of the magnetoresistance effect element 10. The direct current flows to the ground G through the wirings 30 and 31 and the magnetoresistance effect element 10. The potential of the magnetoresistance effect element 10 changes according to Ohm's law. A high-frequency signal is output from the output port 29 in response to a change in the potential (a change in the resistance value) of the magnetoresistance effect element 10.

Since the high-frequency device 104 shown in FIG. 14 includes the magnetoresistance effect element 10 containing a crystallized Heusler alloy and having a large change width of the resistance value, a high-frequency signal with a large output can be generated.

EXAMPLE

Example 1

As Example 1, the magnetoresistance effect element 10 shown in FIG. 1 was manufactured. The underlayer and the cap layer were made of Ru and the first ferromagnetic layer 1 and the second ferromagnetic layer 2 were made of a Heusler alloy having a composition ratio of $Co_2FeGa_{0.5}Ge_{0.8}$. The first non-magnetic layer 3 was made of Ag and the second non-magnetic layer 4 was made of MgO.

The magnetoresistance effect element 10 according to Example 1 was manufactured according to the following procedure. First, a Ru underlayer was formed on an amorphous substrate by sputtering. Next, a first ferromagnetic layer with the above-described composition was formed. At this time point, the first ferromagnetic layer was amorphous.

Next, an alloy film with a thickness of 0.5 nm was sputtered on the first ferromagnetic layer by using the alloy of Mg and Ag as a target. The composition ratio of Mg and Ag in the target of the alloy of Mg and Ag is Mg:Ag=50:50 in atomic percentage. Next, the alloy film produced in an oxygen atmosphere was oxidized. As a result of oxidation, a part of Mg became MgO.

Next, the Ag layer and the Mg and Ag alloy layer were laminated in this order. The thickness of the Ag layer was set to 4 nm and the thickness of the Mg and Ag alloy layer was set to 0.5 nm. Next, the alloy film produced under the oxygen atmosphere was oxidized again and the Mg portion of the Mg and Ag alloy layer was oxidized.

The second ferromagnetic layer with the above-described composition was formed again, a Ru cap layer was formed, and a laminate was annealed. The annealing was performed for 5 hours at the condition of 300° C. By the annealing, the first ferromagnetic layer 1 and the second ferromagnetic layer 2 were crystalized.

In the obtained magnetoresistance effect element 10, the area ratio occupied by the second non-magnetic layer 4 (MgO) on the surface on which the second non-magnetic layer 4 (MgO) is disposed in a plan view from the lamination direction using SEM was 50%.

The MR ratio and the RA (surface resistance) of the manufactured magnetoresistance effect element 10 were measured. For the MR ratio, the resistance value change of the magnetoresistance effect element 10 was measured by monitoring a voltage applied to the magnetoresistance effect element 10 using a voltmeter while sweeping the magnetic field from the outside to the magnetoresistance effect element 10 in a state in which a constant current flows to the magnetoresistance effect element in the lamination direction. The resistance value when the magnetization directions of the first ferromagnetic layer 1 and the second ferromagnetic layer 2 were parallel and the resistance value when the magnetization directions of the first ferromagnetic layer 1 and the second ferromagnetic layer 2 were antiparallel were measured and the MR ratio was calculated from the obtained resistance values using the following formula. The MR ratio was measured at 300 K (room temperature).

$$MR \text{ ratio } (\%)=(R_{AP}-R_P)/R_P \times 100$$

$R_P$ indicates the resistance value when the magnetization directions of the first ferromagnetic layer 1 and the second ferromagnetic layer 2 are parallel and $R_{AP}$ indicates the resistance value when the magnetization directions of the first ferromagnetic layer 1 and the second ferromagnetic layer 2 are antiparallel.

RA was obtained by the product of the resistance $R_P$ when the magnetization directions of the first ferromagnetic layer 1 and the second ferromagnetic layer 2 are parallel and the area A of the magnetoresistance effect element 10 in an in-plane direction.

In the magnetoresistance effect element 10 according to Example 1, the MR ratio was 19.8% and the RA was 0.14 Ω·μm².

Examples 2 to 7

Examples 2 to 7 are different from Example 1 in that the ratio occupied by the second non-magnetic layer 4 in a plan view of the magnetoresistance effect element 10 is changed. In Examples 2 to 8, the area ratio occupied by the second non-magnetic layer 4 in a plan view was changed by changing the composition ratio of Mg and Ag in the Mg and Ag alloy layer.

In Example 2, the area ratio occupied by the second non-magnetic layer 4 in a plan view from the lamination direction was 5%.

In Example 3, the area ratio occupied by the second non-magnetic layer 4 in a plan view from the lamination direction was 10%.

In Example 4, the area ratio occupied by the second non-magnetic layer 4 in a plan view from the lamination direction was 20%.

In Example 5, the area ratio occupied by the second non-magnetic layer 4 in a plan view from the lamination direction was 30%.

In Example 6, the area ratio occupied by the second non-magnetic layer 4 in a plan view from the lamination direction was 60%.

In Example 7, the area ratio occupied by the second non-magnetic layer 4 in a plan view from the lamination direction was 80%.

In Example 8, the area ratio occupied by the second non-magnetic layer 4 in a plan view from the lamination direction was 90%.

In the magnetoresistance effect element according to Example 2, the MR ratio was 7.5% and the RA was 0.089 Ω·μm².

In the magnetoresistance effect element according to Example 3, the MR ratio was 10.1% and the RA was 0.09 Ω·μm².

In the magnetoresistance effect element according to Example 4, the MR ratio was 16.1% and the RA was 0.1 Ω·μm².

In the magnetoresistance effect element according to Example 5, the MR ratio was 17.5% and the RA was 0.11 Ω·μm².

In the magnetoresistance effect element according to Example 6, the MR ratio was 21% and the RA was 0.15 Ω·μm².

In the magnetoresistance effect element according to Example 7, the MR ratio was 11.5% and the RA was 0.2 Ω·μm².

In the magnetoresistance effect element according to Example 8, the MR ratio was 7.2% and the RA was 0.32 Ω·μm.

Example 9

In Example 9, the magnetoresistance effect element 10 shown in FIG. 9 was manufactured. The manufacturing method is different from that of Example 1 in that the second non-magnetic layer 4 is formed on a surface on the side opposite to a surface which is in contact with the first non-magnetic layer 3 in the first ferromagnetic layer 1 and the second ferromagnetic layer 2.

In the underlayer 5, Ru was first formed into a film with a thickness of 20 nm and then the targets of Ru and Mg were simultaneously sputtered to form a metal film with a thickness of 0.5 nm. The electric power applied to the Ru target and the Mg target was adjusted so that the mixing ratio of Ru and Mg was Ru:Mg=50:50 in atomic percentage. Then, the Mg portion was oxidized by oxidizing the underlayer in an oxygen atmosphere and the oxidized portion was formed as the second non-magnetic layer 4.

In the cap layer 6, after forming the second ferromagnetic layer 2 first, a metal film with a thickness of 0.5 nm was formed by simultaneously sputtering from the targets of Ru and Mg. The electric power applied to the Ru target and the Mg target was adjusted so that the mixing ratio of Ru and Mg was Ru:Mg=50:50 in atomic percentage. Then, the Mg portion was oxidized due to the oxidation in an oxygen atmosphere and the oxidized portion was formed as the second non-magnetic layer 4. Then, Ru was formed into a film of 20 nm.

The area ratio occupied by the second non-magnetic layer 4 (MgO) in a surface on which the second non-magnetic layer 4 (MgO) was disposed when the obtained magnetoresistance effect element 10 was viewed from above in the lamination direction was 50%.

In the magnetoresistance effect element according to Example 9, the MR ratio was 17.8% and the RA was 0.13 Ω·μm².

Comparative Example 1

Comparative Example 1 is different from Example 1 in that the second non-magnetic layer is not provided. In Comparative Example 1, after forming the first ferromagnetic layer 1, an Ag layer was formed with a thickness of 4 nm and the second ferromagnetic layer 2 was formed thereon.

In the magnetoresistance effect element according to Comparative Example 1, the MR ratio was 3.6% and the RA was 0.08 Ω·μm².

Comparative Example 2

Comparative Example 2 is different from Example 1 in that the second non-magnetic layer does not have a discontinuous portion and is formed as a uniform layer with respect to the lamination surface. In Comparative Example 2, after forming the first ferromagnetic layer 1, an MgO layer with a thickness of 0.5 nm (the area ratio of MgO: 100%), an Ag layer with a thickness of 4 nm, and an MgO layer with a thickness of 0.5 nm were formed in this order and the second ferromagnetic layer 2 was formed thereon.

In the magnetoresistance effect element according to Comparative Example 2, the MR ratio was 4.2% and the RA was 0.5 Ω·μm².

What is claimed is:

1. A magnetoresistance effect element comprising:
   a first ferromagnetic layer;
   a second ferromagnetic layer;
   a first non-magnetic layer; and
   a second non-magnetic layer, wherein
   the first ferromagnetic layer and the second ferromagnetic layer are formed so that at least one of them includes a Heusler alloy layer,
   the first non-magnetic layer is provided between the first ferromagnetic layer and the second ferromagnetic layer,
   the second non-magnetic layer is in contact with any surface of the Heusler alloy layer and has a discontinuous portion with respect to a lamination surface, and the second non-magnetic layer is made of a material different from that of the first non-magnetic layer and is a (001)-oriented oxide containing Mg.

2. The magnetoresistance effect element according to claim 1,
wherein an area ratio occupied by the second non-magnetic layer in a plan view from a lamination direction is 10% or more and 80% or less.

3. The magnetoresistance effect element according to claim 2,
wherein an area ratio occupied by the second non-magnetic layer in the plan view from the lamination direction is 20% or more and 60% or less.

4. The magnetoresistance effect element according to claim 1,
wherein the Heusler alloy layer is mainly oriented in a (001) direction.

5. The magnetoresistance effect element according to claim 1,
wherein the second non-magnetic layer contains one or more element selected from a group consisting of Al, Ga, Ti, and Ni.

6. The magnetoresistance effect element according to claim 1,
wherein the Heusler alloy layer is represented by a composition formula $Co_2Y_\alpha Z_\beta$,
wherein the Y is one or more elements selected from a group consisting of Fe, Mn, and Cr,
wherein the Z is one or more elements selected from a group consisting of Si, Al, Ga, and Ge, and
wherein $\alpha+\beta>2$ is satisfied.

7. The magnetoresistance effect element according to claim 6,
wherein the Y is Fe and the Z is Ga and Ge.

8. The magnetoresistance effect element according to claim 1,
wherein the Heusler alloy layer is represented by a composition formula $Co_2Fe_\alpha Ga_{\beta 1} Ge_{\beta 2}$, and
wherein $\alpha+\beta 1+\beta 2 \geq 2.3$, $\alpha < \beta 1+\beta 2$, $0.5 < \alpha < 1.9$, $0.1 \leq \beta 1$, and $0.1 \leq \beta 2$ are satisfied.

9. The magnetoresistance effect element according to claim 1,
wherein the first non-magnetic layer is a metal or alloy containing one or more element selected from a group consisting of Cu, Au, Ag, Al, and Cr.

10. The magnetoresistance effect element according to claim 1, further comprising:
a substrate,
wherein the substrate is an underlying layer on which the first ferromagnetic layer, the second ferromagnetic layer, the first non-magnetic layer, and the second non-magnetic layer are laminated, and
wherein the substrate is amorphous.

* * * * *